(12) United States Patent
Kocurek et al.

(10) Patent No.: US 10,356,914 B2
(45) Date of Patent: Jul. 16, 2019

(54) METHOD OF LAMINATION OF DIELECTRIC CIRCUIT MATERIALS USING ULTRASONIC MEANS

(71) Applicant: Raytheon Company, Waltham, MA (US)

(72) Inventors: Patrick J. Kocurek, Allen, TX (US); Sankerlingam Rajendran, Plano, TX (US)

(73) Assignee: RAYTHEON COMPANY, Waltham, MA (US)

( * ) Notice: Subject to any disclaimer, the term of this patent is extended or adjusted under 35 U.S.C. 154(b) by 210 days.

(21) Appl. No.: 15/331,307

(22) Filed: Oct. 21, 2016

(65) Prior Publication Data

US 2017/0290172 A1 Oct. 5, 2017

Related U.S. Application Data

(60) Provisional application No. 62/317,888, filed on Apr. 4, 2016.

(51) Int. Cl.

| H05K 3/46 | (2006.01) |
|---|---|
| H05K 3/00 | (2006.01) |
| H05K 3/30 | (2006.01) |
| H05K 3/40 | (2006.01) |
| H05K 1/18 | (2006.01) |

(52) U.S. Cl.
CPC ......... *H05K 3/4626* (2013.01); *H05K 3/0055* (2013.01); *H05K 3/30* (2013.01); *H05K 3/4038* (2013.01); *H05K 3/4632* (2013.01); *H05K 3/4697* (2013.01); *H05K 1/185* (2013.01); *H05K 2201/015* (2013.01); *H05K 2201/0141* (2013.01); *H05K 2201/0154* (2013.01); *H05K 2203/025* (2013.01); *H05K 2203/0285* (2013.01); *H05K 2203/065* (2013.01)

(58) Field of Classification Search
CPC ....... H01L 23/34; H01L 23/552; H05K 13/04; H05K 13/046; H05K 1/185; H05K 3/0055; H05K 3/30; H05K 3/4626; H05K 3/4632; H05K 3/4038; H05K 3/4697; H05K 2201/0141; H05K 2201/015; H05K 2201/0154; H05K 2203/025; H05K 2203/0285; H05K 2203/065
See application file for complete search history.

(56) References Cited

U.S. PATENT DOCUMENTS

| 4,659,614 A | 4/1987 | Vitale |
| 5,190,608 A | 3/1993 | Darcy et al. |

(Continued)

OTHER PUBLICATIONS

Zhang et al., "Advanced Packaging Using Liquid Crystalline Polymer (LCP) Substrates", Auburn University, Jan. 2002, 11 pages.

(Continued)

*Primary Examiner* — Carl J Arbes
(74) *Attorney, Agent, or Firm* — Cantor Colburn LLP

(57) ABSTRACT

A method of lamination of dielectric circuit materials is provided. The method includes preparing first and second circuit layers of dielectric materials, stacking the first and second circuit layers with circuit trace elements interposed between the first and second circuit layers and ultrasonically welding the second circuit layer onto the first circuit layer around the circuit trace elements.

18 Claims, 5 Drawing Sheets

(56) References Cited

U.S. PATENT DOCUMENTS

| | | | |
|---|---|---|---|
| 5,454,506 | A | 10/1995 | Jordhamo et al. |
| 5,719,354 | A | 2/1998 | Jester et al. |
| 6,019,271 | A | 2/2000 | Hayden et al. |
| 6,101,705 | A | 8/2000 | Wolfson et al. |
| 6,596,947 | B1 | 7/2003 | Kurita et al. |
| 6,663,611 | B2 | 12/2003 | Blaney et al. |
| 6,709,769 | B1 | 3/2004 | Pedretti |
| 6,716,778 | B1 | 4/2004 | Hottner |
| 7,470,977 | B2 * | 12/2008 | Okubora ............ H01L 23/04 257/659 |
| 8,491,739 | B2 | 7/2013 | Germann et al. |
| 8,535,476 | B2 | 9/2013 | Casati et al. |
| 2010/0084748 | A1 | 4/2010 | Poddar et al. |
| 2012/0061023 | A1 | 3/2012 | Germann et al. |
| 2012/0247641 | A1 | 10/2012 | Ruggiero et al. |

OTHER PUBLICATIONS

ISR/WO, dated Aug. 21, 2017, PCT Application No. PCT/US2017/025006, 10 pages.

\* cited by examiner

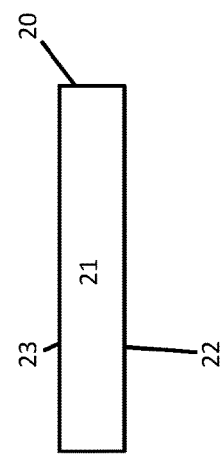
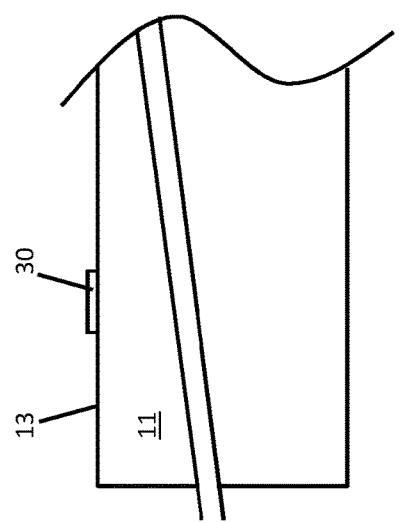
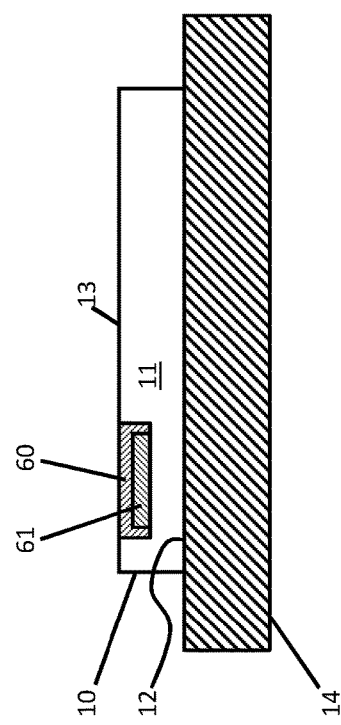
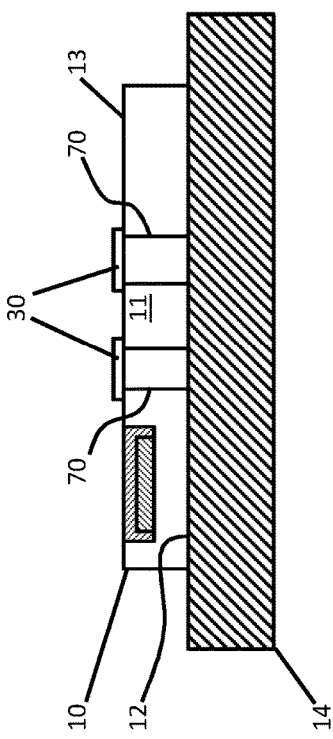

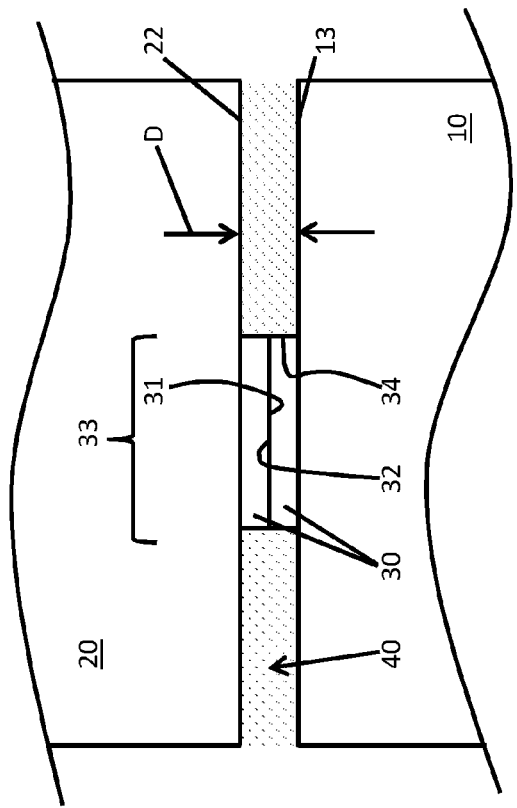
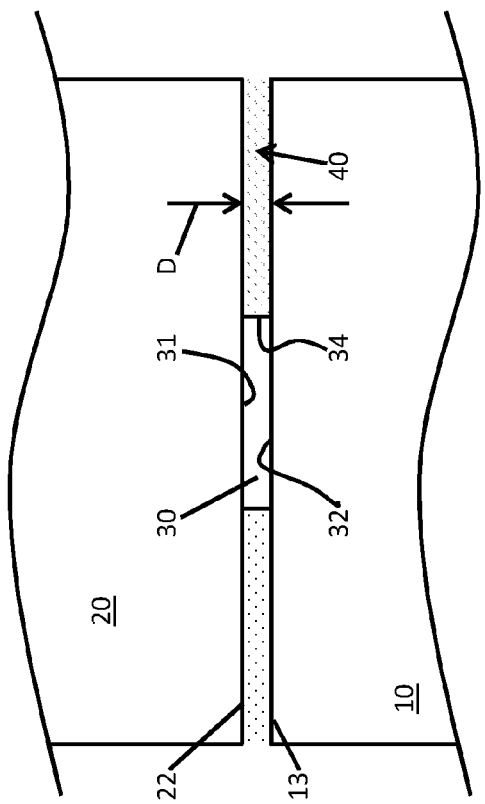

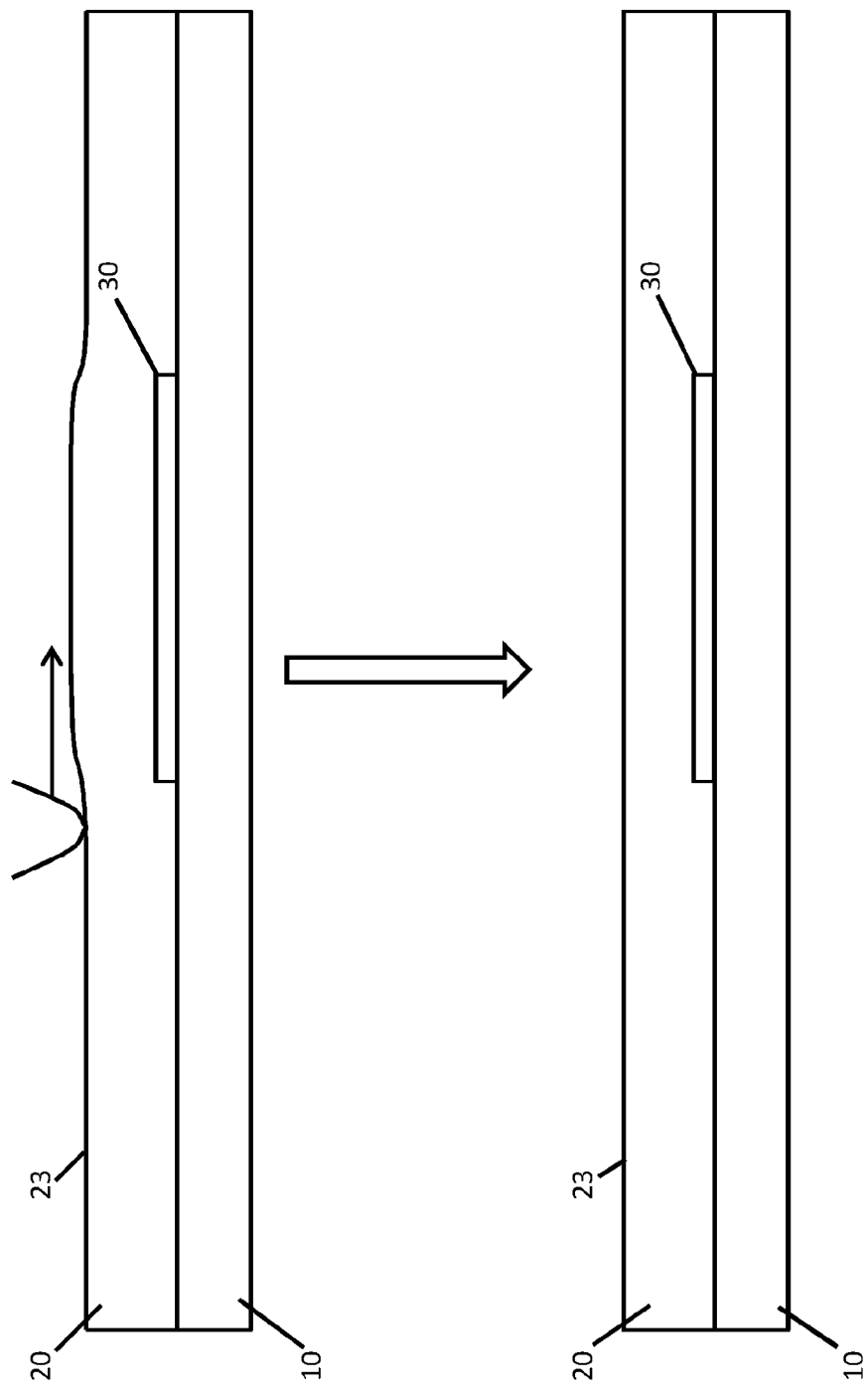

METHOD OF LAMINATION OF DIELECTRIC CIRCUIT MATERIALS USING ULTRASONIC MEANS

DOMESTIC PRIORITY

This application is a non-provisional of and claims priority to U.S. application Ser. No. 62/317,888, entitled "ULTRASONIC LAMINATION OF DIELECTRIC CIRCUIT MATERIALS", filed on Apr. 4, 2016 which is incorporated herein by reference in its entirety.

BACKGROUND

The present disclosure relates to ultrasonic lamination of the dielectric circuit materials.

Electrical circuits can be formed by many different processes. In some cases, layers of dielectric circuit material, such as liquid crystal polymer (LCP), are laminated to metallic heat sinks and to other dielectric layers with the resulting device placed into an autoclave to cure. These types of processes are often slow, labor intensive, expensive and tend to limit the types of device features that can be achievably formed. In other cases, large heat presses can be used to laminate circuit materials but such equipment is expensive and presents operational risks.

Ultrasonic welding is an industrial technique whereby high-frequency ultrasonic acoustic vibrations are locally applied to workpieces being held together under pressure to create a solid-state weld. Ultrasonic welding is commonly used for plastics and especially for joining dissimilar materials. In ultrasonic welding, there are no connective bolts, nails, soldering materials or adhesives necessary to bind the materials together.

SUMMARY

According to one embodiment, a method of lamination of dielectric circuit materials is provided. The method includes preparing first and second circuit layers of dielectric materials, stacking the first and second circuit layers with circuit trace elements interposed between the first and second circuit layers and ultrasonically welding the second circuit layer onto the first circuit layer around the circuit trace elements.

According to another embodiment, a method of lamination of dielectric circuit materials is provided. The method includes preparing first and second circuit layers of dielectric materials, disposing circuit trace elements on at least one of an upper surface of the first circuit layer and a lower surface of the second circuit layer, stacking the first and second circuit layers such that the lower surface of the second circuit layer lies above the upper surface of the first circuit layer and ultrasonically welding the lower surface of the second circuit layer onto the upper surface of the first circuit layer around the circuit trace elements.

According to yet another embodiment, a method of lamination of dielectric circuit materials is provided. The method includes preparing a first circuit layer of first dielectric materials and a second circuit layer of second dielectric materials, stacking the first and second circuit layers with circuit trace elements interposed between the first and second circuit layers, ultrasonically welding the second dielectric material onto the first dielectric material around the circuit trace elements, bonding circuit trace elements abutting other circuit trace elements and bonding the first or second dielectric materials to circuit trace elements to which the first or second dielectric materials abut.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts:

FIG. 1 is a side view of circuit layer formation in accordance with embodiments;

FIG. 2 is a side view of circuit trace elements disposed on circuit layers in accordance with embodiments;

FIG. 3 is an enlarged side view of relative thicknesses of circuit layers and circuit trace elements in accordance with embodiments;

FIG. 4 is a side view illustrating a stacking of first and second circuit layers;

FIG. 5 is a side view illustrating a stacking of first and second circuit layers where circuit trace elements intersect and overlap;

FIG. 10 is a side view illustrating a machining, re-melting or polishing of a second circuit layer in accordance with embodiments.

DETAILED DESCRIPTION

Figure 6:
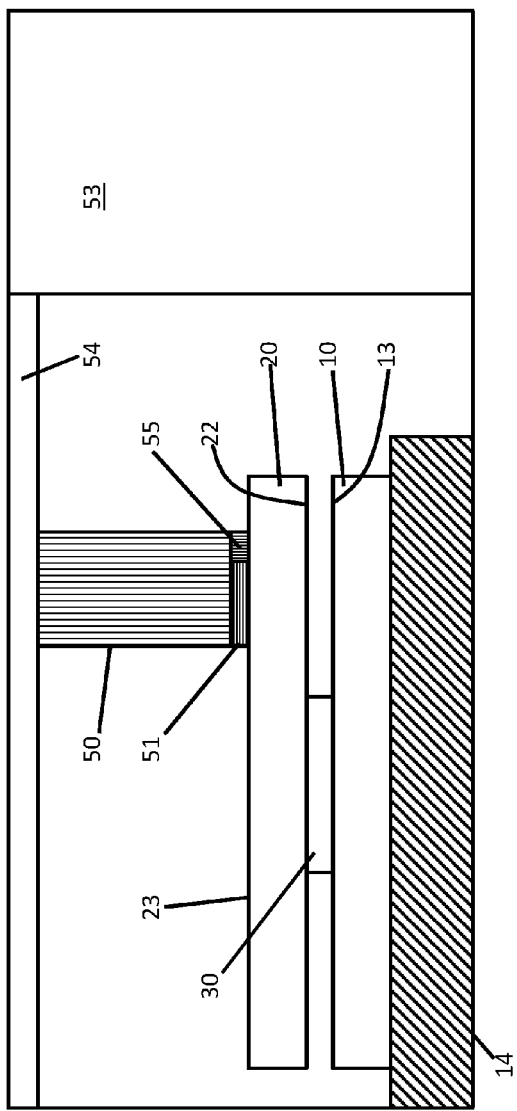
FIG. 6 is a side view of an ultrasonic welding horn and an ultrasonic welding device in accordance with embodiments.

As will be described below, ultrasonic energy is applied to a stack-up of laminate materials to thereby generate friction and heat at interfaces between the laminate materials. Such friction and heat results in a strong ultrasonic weld between the laminate materials. Moreover, since the ultrasonic energy can be applied selectively, laminate materials like dielectrics can be laminated over cavities without the dielectric materials sagging into the cavities. The following description also relates to performance of appropriate surface and/or bulk treatments of dielectric films and/or metal layers in order to facilitate ultrasonic bonding between two dielectric films, metal layers to dielectric films and metal layers to metal layers. The surface and/or bulk treatments may include, for example, chemical and thermal treatments of dielectric film and/or metal layers for bonding and stability of various materials during bonding processing.

For the purposes of the description provided herein, it is to be understood that the term "ultrasonic welding" or UW is synonymous with ultrasonic consolidation (UC) processing, ultrasonic additive manufacturing (UAM) and/or other similar processing methods. The use of the ultrasonic welding terminology is provided for clarity and brevity and is not intended to otherwise limit the scope of the application as a whole.

With reference to FIGS. 1-7, a method of lamination of dielectric circuit materials is provided.

As shown in FIG. 1, the method includes an initial stage of preparing a first circuit layer 10 of dielectric materials and a second circuit layer 20 of dielectric materials. The dielectric materials of the first and second circuit layer 10 and 20 may be similar or different and may include, for example, liquid crystal polymer (LCP) or another similar material. Once prepared, the first circuit layer 10 has a body 11, a lower surface 12 and an upper surface 13. The lower surface 12 may be seated on an anvil 14 for stability and support. The upper surface 13 may be generally planarized or flat. Meanwhile, the second circuit layer 20 has a body 21, a lower surface 22 and an upper surface 23. The lower and upper surfaces 22 and 23 may both be generally planarized and flat.

As shown in FIG. 2, the method also includes disposing circuit trace elements 30 on at least one of the upper surface 13 of the first circuit layer 10 and the lower surface 22 of the second circuit layer 20 (the former case is illustrated in FIG. 2 and is not to scale). In either case, the circuit trace elements 30 may be formed of electrically conductive materials and may be shaped to lie substantially flat against the upper surface 13 or the lower surface 22. The circuit trace elements 30 may extend continuously along the upper surface 13 or the lower surface 22 or may be provided as a plurality of circuit trace elements 30. As shown in FIG. 3, a thickness of the circuit trace elements 30 may be substantially smaller than a corresponding thickness of the first circuit layer 10 or the second circuit layer 20.

It is to be understood that the circuit trace elements 30 can be provided, for example, as metallic traces on the upper surface 13 of the first circuit layer 10, as metallic ground vias on the lower surface 22 of the second circuit layer 20, as metallic traces on the upper surface 23 of the second circuit layer 20 and as metallic ground vias on a lower surface of an additional circuit layer (and so on for as many layers as are provided). The following description will relate to such embodiments generally but is applicable to other formations and configurations as well.

As shown in FIG. 4, the method includes an intermediate stage operation of stacking the first and second circuit layers 10 and 20. In accordance with embodiments, such stacking may be conducted such that the lower surface 22 of the second circuit 20 layer lies above the upper surface 13 of the first circuit layer 10. Thus, where the circuit trace elements 30 are disposed on the upper surface 13 of the first circuit layer 10, the lower surface 22 of the second circuit layer 20 is brought into near but not actual contact with the upper surface 13 of the first circuit layer 10 and into actual contact with upper surfaces 31 of the circuit trace elements 30. Conversely, where the circuit trace elements 30 are disposed on the lower surface 22 of the second circuit layer 20, the upper surface 13 of the first circuit layer 10 is brought into near but not actual contact with the lower surface 22 of the second circuit layer 20 and lower surfaces 32 of the circuit trace elements 30.

In accordance with embodiments in which circuit trace elements 30 are disposed on the upper surface 13 of the first circuit layer 10 and the lower surface 22 of the second circuit layer 20, it is possible that circuit trace elements 30 will intersect with each other and thus overlap. In such cases, when the first and second circuit layers 10 and 20 are stacked, the intersecting and overlapping circuit trace elements 30 will abut one another at intersection points 33 as shown in FIG. 5. That is, the upper surface 31 of circuit trace elements 30 of the first circuit layer 10 will abut with the lower surface 32 of circuit trace elements 30 of the second circuit layer 10 at intersection points 33 at which intersections and overlapping conditions are in effect.

At a conclusion of the stacking operation, the lower surface 22 of the second circuit 20 layer lies above the upper surface 13 of the first circuit layer 10 in an abutment condition or at a distance D. In the former case, which is consistent with the second circuit layer 20 being compliant or deformable under gravitational loading, the lower surface 22 of the second circuit 20 layer abuts with the upper surface 13 of the first circuit layer 10 except for small regions proximate to the sidewalls 34 of the circuit trace elements 30. In the latter case, which is consistent with the second circuit layer 20 being substantially rigid, the distance D may be substantially equivalent to a thickness (see FIG. 4) of the circuit trace elements 30 in non-intersecting and non-overlapping cases. Alternatively, in cases where circuit trace elements 30 intersect and overlap, the distance D may be substantially equivalent to the combined thicknesses of the circuit trace elements 30. In either case, a region of empty space 40 having a thickness that is substantially equivalent to the distance D is defined between the upper surface 13 of the first circuit layer 10 and the lower surface 22 of the second circuit layer 20 and is delimited by the sidewalls 34 of the circuit trace elements 30.

Figure 7:
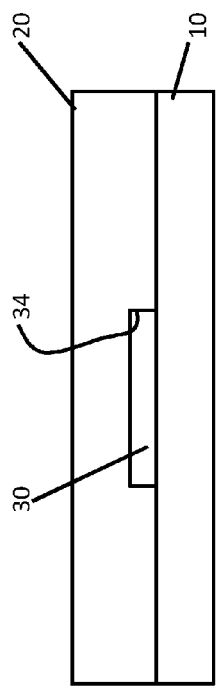
FIG. 7 is an enlarged side view of dielectric material that has flown into space between first and second circuit layers.

As shown in FIGS. 6 and 7, at a later stage, the method includes positioning an ultrasonic welding horn 50, which may include a sonotrode to which a converter or piezoelectric transducer is coupled and an optional booster, against the second circuit layer 20 such that a grip surface 51 of the ultrasonic welding horn 50 abuts with the upper surface 23 of the second circuit layer 20, activating the ultrasonic welding horn 50 and thus ultrasonically welding the lower surface 22 of the second circuit layer 20 onto the upper surface 13 of the first circuit layer 10 around the circuit trace elements 30. In accordance with embodiments, such ultrasonic welding includes vibrating the grip surface 51 at a high frequency (e.g., an ultrasonic frequency or frequencies of about 15 kHz, 20 kHz, 30 kHz, 35 kHz, 40 kHz and 70 kHz) against the upper surface 22 such that a temperature of the second circuit layer 20 is raised beyond a melting point thereof. In particular, the ultrasonic welding is conducted so that the temperature of the second circuit layer 20 is raised beyond a melting point thereof such that the dielectric material of at least the lower surface 22 of the second circuit layer 20 melts without the dielectric material of the upper surface 13 of the first circuit layer 10 similarly melting.

As a result of the ultrasonic welding and, as shown in FIG. 7, the melting dielectric material of the lower surface 22 of the second circuit layer 20 flows into and eventually fills whatever empty space exists between the first and second circuit layers 10 and 20. As such, upon completion of the ultrasonic welding, the flown dielectric material of the second circuit layer 20 contacts with substantial entireties of exposed portions of the upper surface 13 of the first circuit layer 10 and the sidewalls 34 of the circuit trace elements 30.

With continued reference to FIG. 6, an area or profile of the grip surface 51 may be smaller than a corresponding area or profile of the upper surface 23 of the second circuit layer 20 and the ultrasonic welding horn 50 may be supportively disposed in an ultrasonic welding device 52. This ultrasonic welding device 52 may include the anvil 14, a controller 53 and servo control elements 54. The servo control elements 54 manipulate the ultrasonic welding horn 50 so as to position the grip surface 51 at particular points on the upper surface 23 and to apply pressure to the particular points on the upper surface 23 by way of the grip surface 51. The servo control elements 54 are controlled by the controller 53.

The controller 53 may include a processing circuit and a memory, which has a map of the circuit trace elements 30 and executable instructions stored thereon as well as material properties of the first and second circuit layers 10 and 20 and the circuit trace elements 30. When executed, these executable instructions cause the processing circuit to read the map and to conduct the ultrasonic welding at particular locations relative to the circuit trace elements 30. For example, the executable instructions may cause the processing circuit to read the map and to conduct the ultrasonic welding on either side but not over the circuit trace elements 30. As another example, the executable instructions may cause the processing circuit to read the map and to conduct the ultrasonic welding at a first energy level range on either side of the circuit trace elements 30 to thereby bond dielectric material to dielectric material and at varying energies over the circuit trace elements 30 to bond dielectric material to metallic/electrically conductive circuit trace element materials.

In accordance with embodiments, the ultrasonic welding horn 50 may be provided as a single horn element to conduct both the stacking and the ultrasonic welding. In such cases, the ultrasonic welding horn 50 may include the grip surface 51 as well as a dispensing feature 55. The dispensing feature 55 is disposed proximate to the grip surface 51 and is configured to dispense the second circuit layer 20 over the first circuit layer 10.

Figure 8:
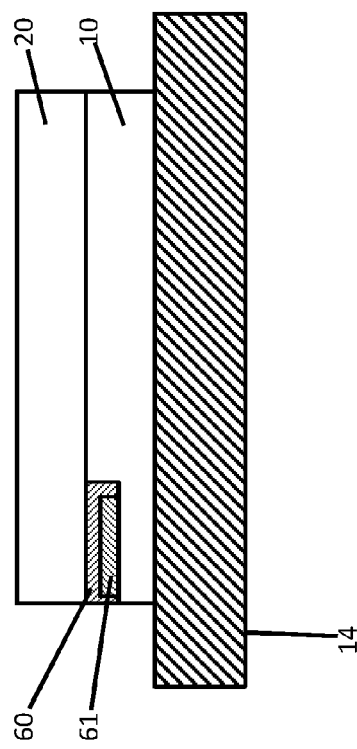
FIG. 8 is a side view illustrating an overhang of a second circuit layer over a cavity formed in a first circuit layer in accordance with alternative embodiments.
Figure 9:
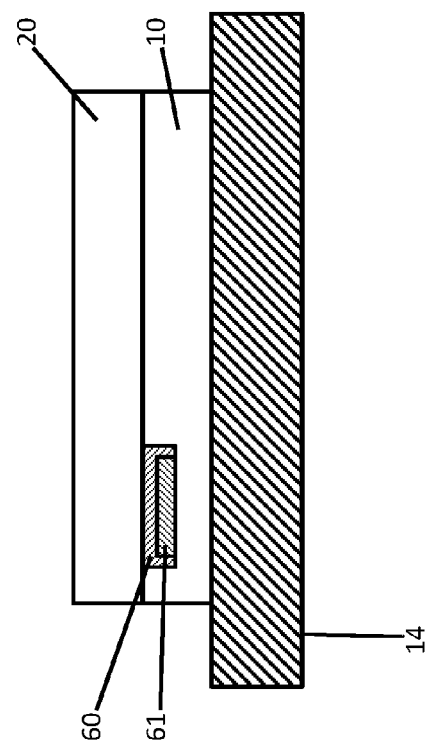
FIG. 9 is a side view illustrating an overhang of a second circuit layer over a cavity formed in a first circuit layer in accordance with alternative embodiments.

In accordance with additional embodiments and, as shown in FIG. 1 and with reference to FIGS. 8 and 9, prior to the stacking of the first and second circuit layers 10 and 20, the method may include the machining of a cavity 60 in at least the upper surface 13 of the first circuit layer 10 at either a periphery of the first circuit layer 10 (see FIG. 8) or a central portion of the first circuit layer 10 (see FIG. 9) and an optional disposition of a device 61 (e.g., an electrical element, a sensor element or a thermal dissipation element) into the cavity 60. Subsequently, the method may further include an execution of the stacking of the first and second circuit layers 10 and 20 such that a corresponding portion of the second circuit layer 20 overhangs the cavity 60 and an avoidance of an execution of ultrasonic welding at a location of the cavity 60 so as to limit any sagging of the second circuit layer 20 into the cavity 60.

The circuit trace elements 30 may be electrically connected to other circuit trace elements, to electrical elements, sensors, thermal dissipation devices, etc. by way of vias 70 (see FIG. 2) that are formed in the first or second circuit layers 10 or 20 at any time prior to or subsequent to the stacking operation or bonds. The bonds may be formed, for example, between intersecting and overlapping circuit trace elements 30 as a secondary result of the ultrasonic welding. That is, where circuit trace elements 30 intersect and overlap with each other (i.e., the circuit trace elements 30 abut with each other) following the stacking operation, the ultrasonic welding may serve to bond the second circuit layer 20 to the first circuit layer 10 as well as to bond the intersecting and overlapping circuit trace elements 30.

In accordance with embodiments and, as noted above, energies of ultrasonic welding processes may be varied such that the ultrasonic welding described above can be used to bond dielectric materials to other dielectric materials, circuit trace elements 30 to other circuit trace elements 30 and dielectric materials to metallic/electrically conductive materials of the circuit trace elements 30. In each case, the energy level range of the ultrasonic welding may be determined by the controller 53 based on the location of the ultrasonic welding horn 50 relative to the map and the melting/bonding temperatures of the various materials of the first and second circuit layers 10 and 20 and the circuit trace elements 30.

With reference to FIG. 10, the method may further include a machining, re-melting or polishing of the second circuit layer 20 to have a predetermined thickness or surface roughness (e.g., 14 µm RA or 100 grit). Such post-processing may be conducted in order to correct for surface roughness of the upper surface 23 due to its abrasive contact with the grip surface 51 and/or to correct for non-uniform thicknesses due to the flowing of the dielectric material of the second circuit layer 20.

Where circuit elements are formed using the processes described above, circuit materials are not subjected to high heat (~300 C or above) for several hours. This in turn enables the use of lower temperature materials and more heat-sensitive components while reducing cycle times from about 8 hours to as little as a few minutes, reducing costs and employing automated controls. Also, since dielectrics can be selectively welded only where attachments are needed, lamination of dielectrics over a cavity is possible without causing dielectric sagging into the cavity. As yet another advantage, circuit assembly size is not limited to what fits in an autoclave, enabling large panels.

The processes described above may be applicable to a wide variety of circuit types. These include conventional Polymer On Metal (POM) circuits, low-cost multi-layer POM circuits for mmW applications, advanced circuits with cavities, overhanging or suspended polymer layers, selective bonding and low temperature materials, power divider circuits with integrated radio frequency (RF) slot radiators, low-loss transmission lines and coax transmission lines (e.g., dielectric straps to suspend printed metal traces).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method of lamination of dielectric circuit materials, the method comprising:
  preparing first and second circuit layers of dielectric materials;
  stacking the first and second circuit layers with circuit trace elements interposed between the first and second circuit layers; and ultrasonically welding the second circuit layer onto the first circuit layer such that:
second circuit layer material melts and flows around the circuit trace elements without first circuit layer material melting, and
the second circuit layer material, which melts and flows around the circuit trace elements, contacts with substantial entireties of respective exposed portions of the first circuit layer and sidewalls of the circuit trace elements.

2. The method according to claim 1, wherein the dielectric materials comprise liquid crystal polymer (LCP), Polyimides and Polytetrafluoroethylene (PTFE).

3. The method according to claim 1, further comprising:
machining a cavity in the first circuit layer;
stacking the first and second circuit layers such that the second circuit layer overhangs the cavity; and
avoiding an execution of ultrasonic welding at a location of the cavity.

4. The method according to claim 3, further comprising disposing an electrical or thermal element into the cavity.

5. The method according to claim 1, further comprising installing vias by which circuit trace elements are connectable.

6. The method according to claim 1, wherein an execution of ultrasonic welding bonds abutting circuit trace elements.

7. The method according to claim 1, further comprising machining, re-melting or polishing the second circuit layer to have a predetermined thickness or surface roughness.

8. A method of lamination of dielectric circuit materials, the method comprising:
preparing first and second circuit layers of dielectric materials;
disposing circuit trace elements on at least one of an upper surface of the first circuit layer and a lower surface of the second circuit layer;
stacking the first and second circuit layers such that the lower surface of the second circuit layer above the upper surface of the first circuit layer; and
ultrasonically welding the lower surface of the second circuit layer onto the upper surface of the first circuit layer around the circuit trace elements such that:
second circuit layer material melts and flows around the circuit trace elements without first circuit layer material melting, and
the second circuit layer material, which melts and flows around the circuit trace elements, contacts with substantial entireties of respective exposed portions of the upper surface of the first circuit layer and sidewalls of the circuit trace elements.

9. The method according to claim 8, wherein the dielectric materials comprise liquid crystal polymer (LCP), Polyimides and Polytetrafluoroethylene (PTFE).

10. The method according to claim 8, further comprising localizing an execution of ultrasonic welding.

11. The method according to claim 8, further comprising controlling a single horn element to conduct the stacking and the ultrasonically welding.

12. The method according to claim 8, further comprising:
machining a cavity in the upper surface of the first circuit layer;
stacking the first and second circuit layers such that the second circuit layer overhangs the cavity; and
avoiding an execution of ultrasonic welding at a location of the cavity.

13. The method according to claim 12, further comprising disposing an electrical or thermal element into the cavity.

14. The method according to claim 8, further comprising installing vias by which circuit trace elements are connectable.

15. The method according to claim 8, wherein an execution of ultrasonic welding bonds abutting circuit trace elements.

16. The method according to claim 8, further comprising machining, re-melting or polishing the second circuit layer to have a predetermined thickness or surface roughness.

17. A method of lamination of dielectric circuit materials, the method comprising:
preparing a first circuit layer of first dielectric materials and a second circuit layer of second dielectric materials;
stacking the first and second circuit layers with circuit trace elements interposed between the first and second circuit layers;
ultrasonically welding the second dielectric material onto the first dielectric material around the circuit trace elements;
bonding circuit trace elements abutting other circuit trace elements; and
bonding the first or second dielectric materials to circuit trace elements to which the first or second dielectric materials abut,
wherein the ultrasonic welding is executed such that:
the second dielectric material melts and flows around the circuit trace elements without the first dielectric material melting, and
the second dielectric material, which melts and flows around the circuit trace elements, contacts with substantial entireties of respective exposed portions of the first circuit layer and sidewalls of the circuit trace elements.

18. The method according to claim 17, wherein the bonding is achieved by at least one of ultrasonic welding, soldering and adhesion.

* * * * *